United States Patent
Hsu et al.

(10) Patent No.: US 8,250,731 B2
(45) Date of Patent: Aug. 28, 2012

(54) ELECTRICAL DEVICE MANUFACTURING METHOD

(75) Inventors: Shih-Kun Hsu, Taipei Hsien (TW);
Sheng-Hung Hou, Taipei Hsien (TW);
Wen-Chang Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 1 day.

(21) Appl. No.: 12/894,160

(22) Filed: Sep. 30, 2010

(65) Prior Publication Data

US 2011/0167618 A1    Jul. 14, 2011

(30) Foreign Application Priority Data

Jan. 8, 2010   (TW) ................ 99100443 A

(51) Int. Cl.
*H05K 13/04*   (2006.01)
*H05K 13/00*   (2006.01)
*G01R 31/28*   (2006.01)

(52) U.S. Cl. ............... 29/593; 29/832; 29/834; 29/836

(58) Field of Classification Search ........... 29/593, 29/832–841
See application file for complete search history.

(56) References Cited

U.S. PATENT DOCUMENTS

| | | | |
|---|---|---|---|
| 5,080,622 A * | 1/1992 | Tuin et al. | 445/8 |
| 6,221,426 B1 * | 4/2001 | Yamanobe | 427/77 |
| 6,383,047 B1 * | 5/2002 | Minami et al. | 445/6 |
| 6,783,414 B2 * | 8/2004 | Minami et al. | 445/6 |
| 7,431,878 B2 * | 10/2008 | Yamanobe | 264/447 |
| 7,433,637 B2 * | 10/2008 | Aoki et al. | 399/297 |
| 7,572,164 B2 * | 8/2009 | Takeda et al. | 445/46 |
| 7,952,265 B2 * | 5/2011 | Iwaki et al. | 313/495 |
| 2002/0090877 A1 * | 7/2002 | Minami et al. | 445/6 |
| 2004/0218228 A1 * | 11/2004 | Ma | 358/474 |
| 2007/0133979 A1 * | 6/2007 | Lackey et al. | 396/428 |
| 2008/0001240 A1 * | 1/2008 | Minamio et al. | 257/434 |
| 2008/0201622 A1 * | 8/2008 | Hiew et al. | 714/718 |
| 2008/0232673 A1 * | 9/2008 | Miyauchi | 382/146 |
| 2008/0290890 A1 * | 11/2008 | Chen et al. | 324/765 |
| 2009/0007426 A1 * | 1/2009 | Aoki et al. | 29/846 |
| 2009/0015782 A1 * | 1/2009 | Yi et al. | 349/187 |
| 2009/0273274 A1 * | 11/2009 | Takeda et al. | 313/498 |
| 2010/0302379 A1 * | 12/2010 | Liu | 348/187 |

* cited by examiner

*Primary Examiner* — Derris Banks
*Assistant Examiner* — Kaying Kue
(74) *Attorney, Agent, or Firm* — Altis Law Group, Inc.

(57) ABSTRACT

An exemplary electrical device manufacturing method includes the following steps. First, a first electronic module is provided. Second, one or more functions of the electronic module are verified. Third, a support module is provided. Fourth, one or more functions of the support module are verified. Fifth, the first electronic module is attached to the support module so as to form a first integrated module. Sixth, one or more functions of the first integrated module are verified.

13 Claims, 2 Drawing Sheets

ELECTRICAL DEVICE MANUFACTURING METHOD

BACKGROUND

1. Technical Field

The present application is related to manufacturing, and more particularly to electrical device manufacturing methods.

2. Description of Related Art

An electrical device such as a consumer electronics device consists of many electronic and mechanical parts. The electrical device must be tested after assembly to ensure operability. At present, functional testing of the electrical device is frequently performed while the electrical device is being fabricated, whereby the electrical device must be repaired or reworked if it fails the testing.

In the repair process or the rework process, the electrical device may require disassembly to determine problems of each part therein, a significantly time-consuming requirement.

BRIEF DESCRIPTION OF THE DRAWINGS

The components in the drawings are not necessarily drawn to scale, the emphasis instead being placed upon clearly illustrating the principles of at least one embodiment.

DETAILED DESCRIPTION

Various embodiments will now be described in detail, with reference to the drawings.

Figure 1:
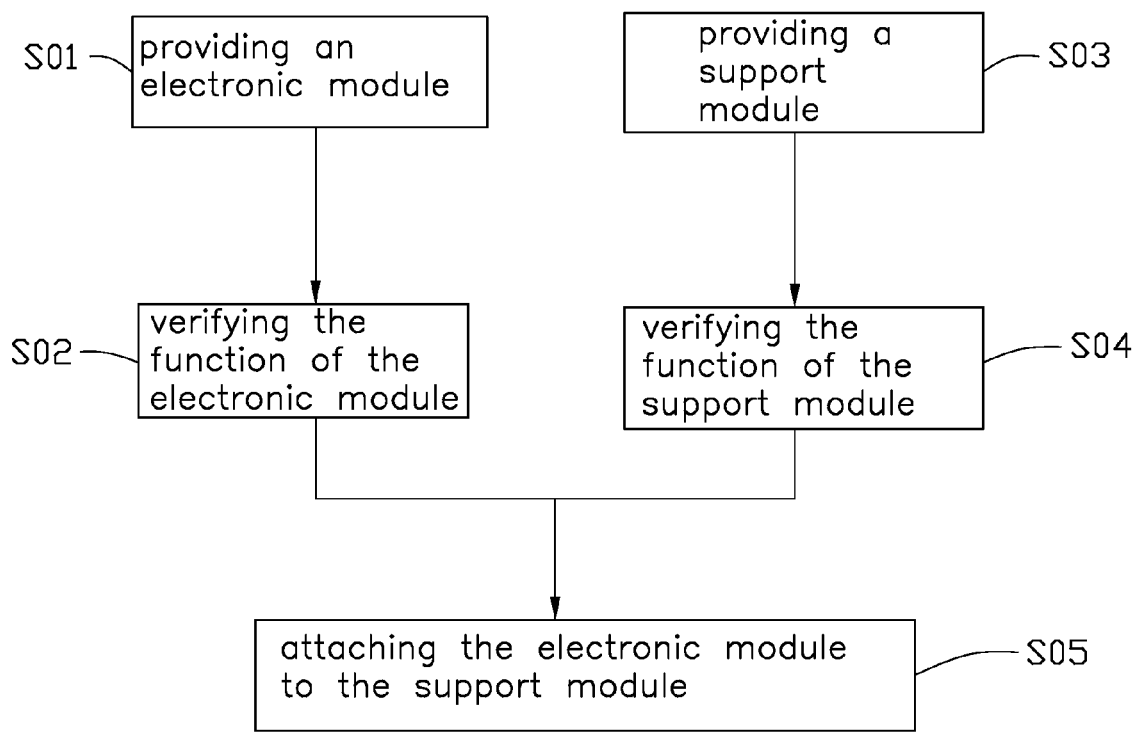
FIG. 1 is a flowchart of an electrical device manufacturing method according to a first embodiment of the disclosure.

Referring to FIG. 1, an electrical device manufacturing method according to a first embodiment of the disclosure includes Steps S01 to S05. The electrical device can for example be a consumer electronics device. Examples of such consumer electronics devices include but are not limited to a digital camera, a mobile phone or a game player.

In Step S01, an electronic module such as an image processing module or a sound and light module is provided. The image processing module can include but is not limited to an image capture unit and an image display unit. The sound and light module can include but is not limited to a lighting unit, a microphone, and an amplifier. The lighting unit may include at least one light emitting diode (LED), organic light emitting diode (OLED), or electroluminescent lamp (EL).

In addition, in alternative embodiments, the electronic module can further include a protective shell or cover to protect the electronic components of the electronic module.

In Step S02, at least one function of the electronic module is verified by testing, the verification items including but not being limited to electrical characteristics, image capture function, image projection function, and optics detection tests. As should be noted, the electrical characteristics test measures impedance, capacitance, and inductance. In addition, the image projection function test typically checks hues, tints or an auto focus function for an image projected from the electronic module onto a surface external to the electronic module. Moreover, the optics detection test measures the brightness or intensity of light emitted by the lighting unit.

In Step S03, a support module is provided, which may be, but is not limited to, a base or holder. The base may provide support on a horizontal surface, and the holder may provide wall-mount capability.

In Step S04, at least one function of the support module is verified by testing, the verification items including but not being limited to endurance such as drop and thermal shock tests.

In Step S05, the electronic module is attached to the support module, resulting in the final electrical device, and at least one electrical function of the electrical device is verified by testing. Such one or more electrical function tests include but are not limited to image capture function, image projection function, and drop and thermal shock tests.

It should be noted that, in alternative embodiments, Step S03 can further include integrating a rotation unit, such as a motor or gear, into the base or holder. In such embodiments, the rotation unit connects the base or holder and the electronic module, providing rotation of the electronic module.

Figure 2:
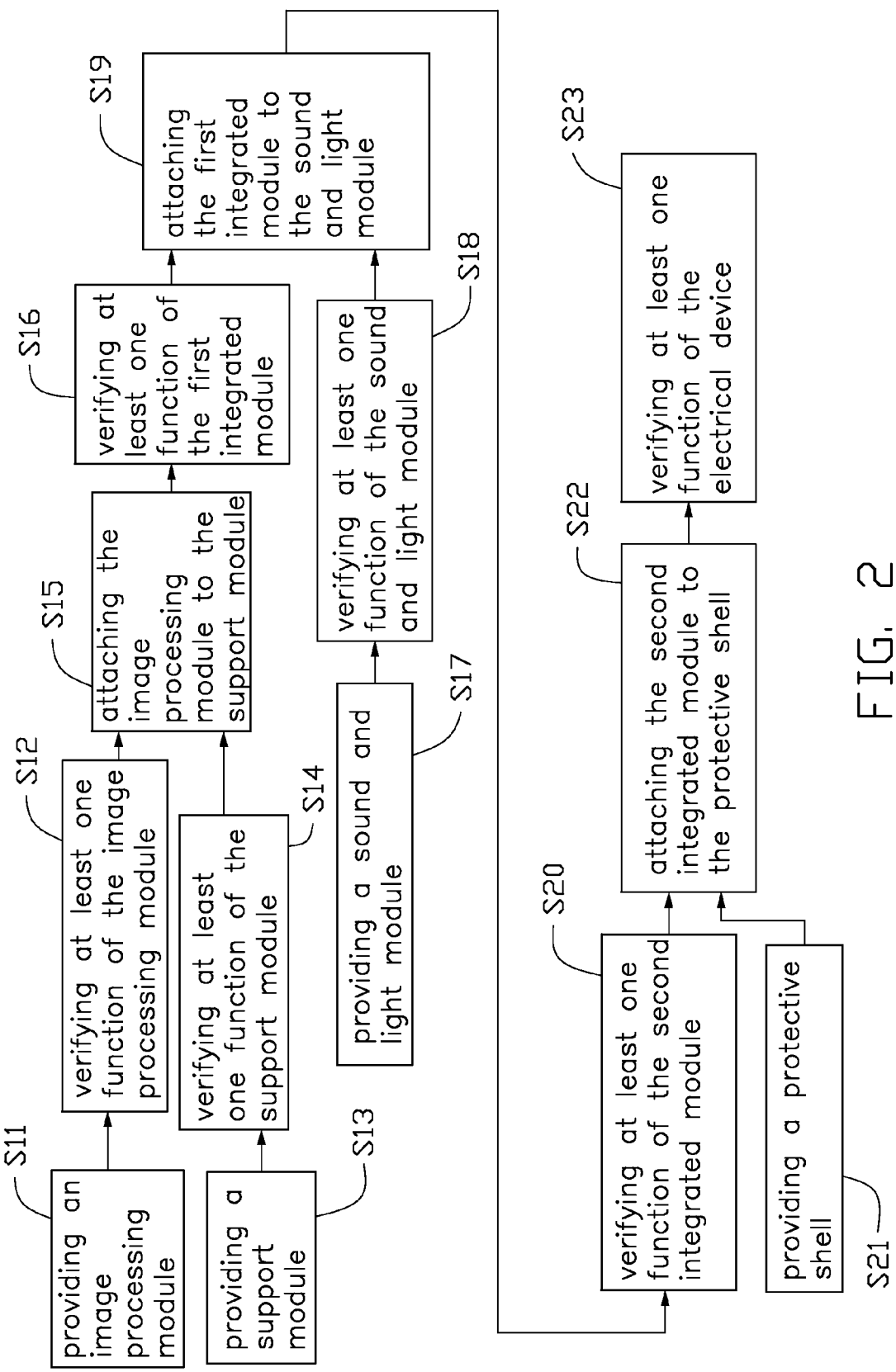
FIG. 2 is a flowchart of an electrical device manufacturing method according to a second embodiment of the disclosure.

FIG. 2 shows an electrical device manufacturing method according to a second embodiment of the disclosure. The electrical device includes a first electronic module, a second electronic module, and a support module. In this exemplary embodiment, the first electronic module is an image processing module and the second electronic module is a sound and light module. The electrical device manufacturing method includes steps as follows.

In Step S11, the image processing module is provided. The image processing module can include but is not limited to an image display module or an image capture module. The image display module may be a display panel or a projector. The image capture module may be an image sensor or a camera module.

In Step S12, at least one function of the image processing module is verified by at least one function test. The function test items include but are not limited to electrical characteristics testing. A test result of the function test includes a pass status and a fail status. The image processing module can be repaired (or reworked) immediately if one of the test results is the fail status. Alternatively, the image processing module may have to be replaced.

In Step S13, the support module is provided. The support module may be, but is not limited to, a base or holder. The base may provide support on a horizontal surface, and the holder may provide wall-mount capability. This step can further include integration of a rotation unit into the base or the holder, wherein the rotation unit can be a motor or gear.

In Step S14, at least one function of the support module is verified by at least one function test. The function test items include but are not limited to endurance such as drop and thermal shock testing. The support module is repaired (or reworked) immediately if one of the test results is the fail status. Alternatively, the support module may have to be replaced.

In Step S15, the image processing module is attached to the support module to form a first integrated module. If present, the rotation unit connects the support module and the image processing module, providing rotation of the image processing module.

In Step S16, at least one function of the first integrated module is verified by at least one function test. The function test items include but are not limited to one or more image tests or an alignment test. The image tests can include image capture function, display function, or image projection function tests. For example, the image projection function test typically checks hues, tints or an auto focus function for an image projected from the image processing module onto a surface external to the image processing module. The alignment test typically checks resolution or display position of an image which is projected onto a surface external to the image processing module or displayed on a screen. The first integrated module can be repaired (or reworked) immediately if one of the test results is the fail status. Alternatively, the first integrated module may have to be replaced.

In Step S17, a sound and light module is provided. The sound and light module can include but is not limited to a light emitting unit, a microphone or an amplifier. The light emitting unit can include at least one light emitting diode (LED) or organic light emitting diode (OLED).

In Step S18, at least one function of the sound and light module is verified by at least one function test. The verification items include but are not limited to optics detection, sound (e.g. voice) capture function of the microphone or sound output function of the amplifier tests. It should be noted that the optics detection test measures the brightness or intensity of light emitted by the light emitting unit. The sound and light module can be repaired (or reworked) immediately if one of the test results is the fail status. Alternatively, the sound and light module may have to be replaced.

In Step S19, the first integrated module and the sound and light module are attached to each other, thereby forming a second integrated module.

In Step S20, at least one function of the second integrated module is verified by at least one function test. The verification items may be same as those in Steps S16 and S18, and may further include synchronization of the first integrated module with the sound and light module. The second integrated module can be repaired (or reworked) immediately if one of the test results is the fail status. Alternatively, the second integrated module may have to be replaced.

In Step S21, a protection module such as a protective shell for covering and protecting the second integrated module is provided.

In Step S22, the protective shell and the second integrated module are attached together, thereby forming an electrical device.

In Step S23, at least one function of the electrical device is verified by at least one function test. The verification items may be same as those in Steps S16, S18 and S20. The electrical device can be repaired (or reworked) immediately if one of the test results is the fail status. Alternatively, the electrical device may have to be discarded.

The yield rate of the electrical device is increased due to pre-assembly verification of the image processing module, the support module, the first integrated module, and the second integrated module, with repair available in each verification process if required.

It is to be understood, however, that even though numerous characteristics and advantages of certain inventive embodiments have been set out in the foregoing description, together with details of the structures and functions of the embodiments, the disclosure is illustrative only; and that changes may be made in detail to the full extent indicated by the broad general meaning of the terms in which the appended claims are expressed.

What is claimed is:

1. An electrical device manufacturing method, comprising:
   providing a first electronic module;
   verifying at least one function of the first electronic module by at least one first function test, wherein a first test result of the first function test includes a first pass status and a first fail status;
   repairing the first electronic module immediately if the first test result is the first fail status;
   providing a support module;
   verifying at least one function of the support module by at least one second function test, wherein a test result of the second function test includes a second pass status and a second fail status;
   repairing the support module immediately if the second test result is the second fail status;
   attaching the first electronic module and the support module together to form a first integrated module;
   verifying at least one function of the first integrated module by at least one third function test, wherein a third test result of the third function test includes a third pass status and a third fail status; and
   repairing the first integrated module immediately if the third test result is the third fail status.

2. The manufacturing method of claim 1, wherein the first electronic module comprises an image processing module.

3. The manufacturing method of claim 2, wherein the verification items of the first electronic module comprise at least one item selected from the group consisting of an image test and an alignment test.

4. The manufacturing method of claim 3, wherein the image test comprises at least one item selected from the group consisting of an image output function test and an image capture function test.

5. The manufacturing method of claim 2, wherein the verification items of the first integrated module comprise at least one item selected from the group consisting of an image test and an alignment test.

6. The manufacturing method of claim 5, wherein the image test comprises at least one item selected from the group consisting of an image output function test and an image capture function test.

7. The manufacturing method of claim 1, wherein the verification items of the support module comprise at least one item selected from the group consisting of a drop test and a thermal shock test.

8. The manufacturing method of claim 1, further comprising:
   providing a second electronic module;
   verifying at least one function of the second electronic module by at least one fourth function test, wherein a fourth test result of the fourth function test includes a fourth pass status and a fourth fail status;
   repairing the second electronic module immediately if the fourth test result is the fourth fail status,
   attaching the first integrated module and the second electronic module together to form a second integrated module;
   verifying at least one function of the second integrated module by at least one fifth function test, wherein a fifth test result of the fifth function test includes a fifth pass status and a fifth fail status;
   repairing the second integrated module immediately if the fifth test result is the fifth fail status.

9. The manufacturing method of claim 8, wherein the second electronic module is a sound and light module.

10. The manufacturing method of claim 9, wherein the verification items of the second electronic module comprise at least one item selected from the group consisting of brightness of light emitted by the second electronic module, intensity of light emitted by the second electronic module, sound capture function, and sound output function tests.

11. The manufacturing method of claim 8, wherein the verification items of the second integrated module comprise at least one item selected from the group consisting of brightness of light emitted by the second integrated module, intensity of light emitted by the second integrated module, sound capture function, and sound output function tests.

12. The manufacturing method of claim 8, further comprising:
 providing a protective shell;
 attaching the second integrated module and the protective shell together, thereby forming the electrical device;
 verifying at least one function of the electrical device by at least one sixth function test, wherein a sixth test result of the sixth function test includes a sixth pass status and a sixth fail status; and
 repairing the electrical device immediately if the sixth test result is the sixth fail status.

13. The manufacturing method of claim 1, wherein providing the support module comprises integrating a rotation module with a base.

* * * * *